United States Patent

[11] 3,585,533

[72] Inventor Roger M. Denhard
Clearwater, Fla.
[21] Appl. No. 14,415
[22] Filed Feb. 26, 1970
[45] Patented June 15, 1971
[73] Assignee Sperry Rand Corporation

[54] MICROWAVE MICROCIRCUIT ELEMENT WITH RESISTIVE HIGH FREQUENCY ENERGY ABSORBER
11 Claims, 3 Drawing Figs.

[52] U.S. Cl. ........ 333/22, 333/81, 333/84
[51] Int. Cl. ........ H01p 3/08, H01p 1/22, H01p 1/26
[50] Field of Search ........ 333/22, 84, 81; 338/216

[56] References Cited
UNITED STATES PATENTS
3,505,619 4/1970 Bishop ........ 333/81
FOREIGN PATENTS
839,208 6/1960 Great Britain ........ 333/84

*Primary Examiner*—Herman Karl Saalbach
*Assistant Examiner*—Marvin Nussbaum
*Attorney*—S. C. Yeaton

ABSTRACT: A high frequency or microwave microcircuit device is disclosed having application as an integrated circuit element for precise attenuation of high frequency or microwave energy or for the accurate termination of a transmission line carrying such energy. The novel microcircuit element is particularly adapted for use in planar integrated microstrip transmission line systems.

PATENTED JUN 15 1971 3,585,533

INVENTOR
ROGER M. DENHARD
BY
HP Terry
ATTORNEY

MICROWAVE MICROCIRCUIT ELEMENT WITH RESISTIVE HIGH FREQUENCY ENERGY ABSORBER

BACKGROUND OF THE INVENTION

1. Field of the Invention

The invention pertains to microcircuit elements of the type adaptable for use, for instance, in microstrip transmission line systems in combination with semiconductor and ferrimagnetic circuit elements suitable for employment in microwave receivers and in other complex microwave systems, compact in size, light in weight, and inexpensive of manufacture. More particularly, the invention relates to transmission line attenuators and energy sinks or matched transmission line terminations adapted for operation with microwave or very high frequency carrier signals and in particular adaptable for use in planar circuit configurations mounted on dielectric substrates, including ferrite substrates.

2. Description of the Prior Art

The electronic industry has moved, because of the ever increasing complexity and diversity of microwave and other high frequency systems, to find circuit elements and system configurations smaller, more reliable, and less costly than have been achieved in the past with discrete microwave components. The move has been away from assembling expensive, hand-tailored discrete components and toward making integrated circuit systems where many components can be fabricated simultaneously along with the fabrication of the basic transmission line circuit of the system.

However, the prior art has not achieved the full benefit that can be realized by forming each circuit system so that discrete elements need not be added. While the continued use of hybrid systems has advanced the art, much remains to be accomplished before successful, fully integrated microwave systems are realized. The prior practice is transitional in nature, the industry being willing to accept use of hybrid planar circuits until fully integrated monolithic microwave circuits replace such interim solutions.

The basis for most prior art microwave integrated circuit designs is the well known planar microstrip transmission line which uses a sheet high dielectric material as a substrate material. A transmission line conductor may be applied to one side of the dielectric sheet and a ground plane of copper or other electrically conductive material to the other side. While microstrip has been the popular planar type of transmission line, it is to be understood in the following discussion of the present invention that other types of transmission lines are used with planar dielectric substrates, such as the balanced strip, the suspended substrate (shield or laminated microstrip), the slot line, the H-guide, and the coplanar types of transmission lines. It is further to be understood that the present invention is applicable to use in such transmission lines. While the discussion which follows is in terms of the use of the invention with microstrip or strip transmission lines, it may also readily be used with other types of transmission lines, including those mentioned above.

Among circuit elements which present discrete circuits often added to hybrid microwave circuits are largely ordinary types of microwave attenuators and terminations. Hand-tailored for precision, they have been undesirably expensive. Often, several such elements are required in any one complex microwave system. Furthermore, the need to connect them into a microcircuit by the use of expensive and bulky coaxial lines and connectors or other transmission lines has seriously added to the complexity and cost of the resultant product.

SUMMARY OF THE INVENTION

The invention is a means for providing microwave or very high radio frequency carrier energy absorption in integrated microcircuits. In one form, it may be used as a series element, for instance, in a planar microstrip transmission line, for the calibrated attenuation of such carrier energy. In another, it serves as a matched termination for such a microstrip line, accurately absorbing energy propagated into it, without reflection. In such embodiments, the invention may comprise a microwave integrated circuit formed on a dielectric substrate, one side of which is coated with a thin conductive ground sheet, while the other has formed on it a desired microstrip circuit. The microstrip circuit is formed of layers comprising chromium overlaid with a good electrical conductor, such as gold.

DESCRIPTION OF THE PREFERRED EMBODIMENT

Figure 1:
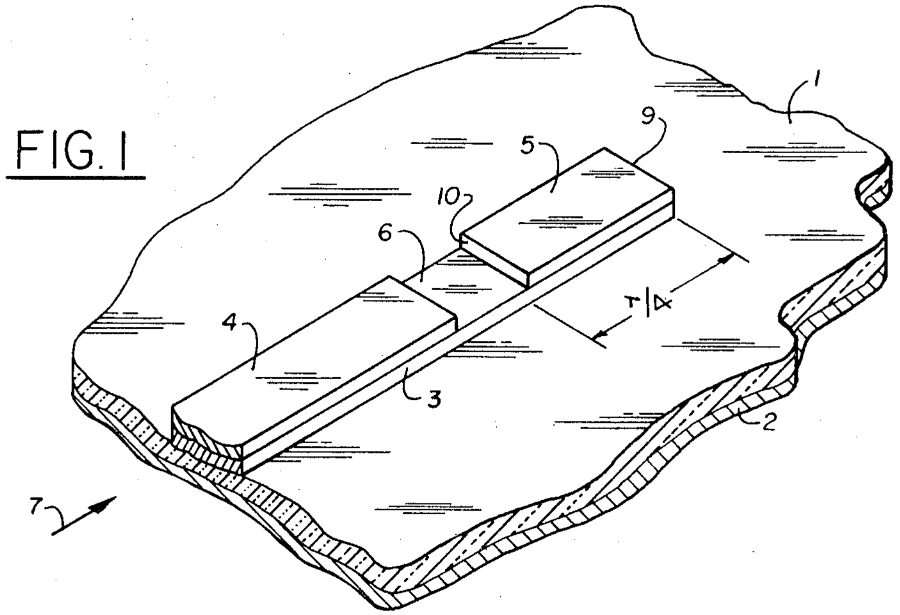
FIG. 1 is a fragmentary perspective view, partly in cross section, of a preferred embodiment of the invention in the form of a matched microcircuit termination.

In FIG. 1, there is shown a microstrip circuit useful at microwave or other very high frequencies as an electromagnetic wave energy absorber or transmission line termination. The transmission line per se comprises at least a dielectric substrate 1 to one surface of which a relatively thin conductive ground sheet 2 may be bonded in any well known manner. For example, sheet 2 may be formed on one surface of substrate 1 by evaporation in a vacuum chamber from a heated source for distilling the desired conductive metal, or by chemical electroplating or by other known metal plating methods.

The transmission line opposite ground plate 2 comprises planar or microstrip transmission line circuit elements bonded to a second or upper surface of substrate 1. Adjacent the microwave signal input denoted by arrow 7, the upper transmission line elements include a layer 3 of a metal having moderate resistivity at the microwave carrier frequency. Of equal significance, it is also a metal which forms a strong bond to the material of dielectric substrate 1. It is also selected to have the property of forming s strong bond to a metal to be plated over it, such as that of metallic layer 4.

According to the invention, evaporated chromium, which establishes a firm bond with the dielectric material, is selected for use as layer 3, while evaporated gold, which in turn forms a firm bond with evaporated chromium, is used for the upper layer 4 since it affords a surface highly conducting for microwave signals. Silver or other good conductors could be used. It is to be understood that the thicknesses of evaporated layers 3 and 4 as shown in FIG. 1 are grossly exaggerated for convenience, as they are actually very thin in comparison to the thickness of substrate 1. It is also to be understood that substrate 1 may be extended in any direction to support many additional active or passive microcircuit elements in any combination desired to furnish the input 7 to the inventive element shown in FIG. 1.

In order that microwave or high frequency energy supplied at input 7 be absorbed, a section 6 of exposed surface of the chromium layer 3 is provided at the end of the conductive layer 4. As the energy propagates down the microstrip in the sense of arrow 7, it is exposed to the resistive chromium surface 6, which has a direct current resistance equal to the characteristic impedance of conductive layer 4. Stub transmission line 5, which is quarter wave in length at the desired carrier frequency, reflects energy from its open end 9 to junction 10 appear to be a short for carrier frequency energy. The equivalent circuit comprised of conductive layer 4, chromium layer 6, and quarter wave conductive stub now looks like a matched transmission line of infinite length.

The width of the conducting layer 4 of the microcircuit element is determined by the usual standards which must be met for the energy propagating in the transmission line to be substantially firmly bonded thereto and to propagate substantially in the TEM mode. The width and the length of the absorptive section 6 are determined by the desired resistance to be achieved in the termination. As is well established, this resistance in ohms is equal to the resistivity of the chromium layer multiplied by the length-to-width ratio of attenuator 6. A resistivity substantially equal to the characteristic impedance of the transmission line is necessary. The length of section 6 is usually selected to be one-half the line width, or less.

The dielectric material of substrate 1 may consist of a 100 percent aluminum oxide ceramic or of other similar ceramics. Certain ferrimagnetic materials may also be used, such as 100 percent yttrium iron garnet. In general, a ceramic material is required having physical properties which will withstand the temperatures used in evaporating the material of the circuit on to the ceramic surface. Also, the dielectric loss tangent should be 0.001 or better. In general, it is the practice to require that the surface of the substrate 1 supporting the microcircuit have a surface finish between 5 to 25 microinches and that the two surfaces of the material be parallel to each other within 0.0005 inches. The overall size and thickness of substrate 1 also depends somewhat upon the circuit that is to be fabricated on it, and upon the carrier frequency at which it will operate. A typical thickness used in operating terminations of the type shown in FIG. 1 has varied from 0.025 to 0.055 inches for an operating wave length, for example, of 3.30 centimeters.

In generating the structure of FIG. 1, the substrate 1 material is brought to a proper size and surface finish by conventional grinding and lapping techniques. It is then cleaned in a conventional ultrasonic cleaner for about 5 minutes in the presence of a strong detergent. After rinsing distilled water at room temperature, it is washed in methyl alcohol and is then dipped into a hot trichloroethylene solution. The substrate is now ready for deposit of the chromium and gold layers.

In order to deposit the chromium layer 3, substrate 1 is placed in a vacuum envelope which can provide a pressure held reliably at $1\times10^{15}$ Torr. After evacuation of the chamber, the substrate is heated to approximately 270° C. A chromium-plated tungsten film already mounted in the vacuum chamber is electrically heated by passing a high current through it; thus deposition of chromium distilling from the filament to the substrate begins. As has been observed, the desired thickness of the chromium film is dependent upon the desired resistivity of the absorptive section 6; it is also dependent upon the surface finish of substrate 1. In practice, the thickness of the chromium layer 3 may vary from 200 to 1500 Angstroms.

The amount of chromium deposited is determined in a conventional manner by observing a monitor meter, since the resistance of the chromium needs to be held to about one percent in order to provide a proper impedance match between the absorbing section 6 and the conductors 4 and 5. For monitoring purposes, an independent substrate element is provided in the vacuum chamber having the same surface finish as the product substrate. A pair of electric conductors is fastened at opposed locations at opposed locations on the substrate and is lead outside of the vacuum chamber to the resistance monitor. Thus, with the chromium films on the product substrate and on the monitor substrate growing at equal rates, the operator may determine the desired thickness of the chromium layer 3 on the product substrate simply by observing the indication of the calibrated resistance monitor meter.

At the conclusion of the deposition of the chromium layer 3, a thin layer of gold is plated over the chromium surface. This is done to prevent oxidation of the chromium surface after it is removed from the vacuum chamber. Such is accomplished by an independent current supply with electrodes in the vacuum chamber to which are fastened a tungsten boat. A piece of 0.040 inch diameter gold wire is, for example, 0.75 inches long, is placed in the tungsten boar which is then heated by passing a very high current through it. As a consequence of the above steps, a thin layer 3 of chromium is bonded to a surface of substrate 1 and a thin layer of gold is placed over the chromium layer. As noted, the chromium layer 3 need be only thick enough to furnish the desired bond between the dielectric material of substrate 1 and the adjacent surface of gold layer 4. The initial gold layer is on the order of 3000 to 4000 Angstroms in thickness.

The next steps in the fabrication of the microcircuit of FIG. 1 are conventional photographic processes successively performed in a dark room in the presence of a weak yellow light only. For this, the substrate with its chromium and thin gold layers is again washed in trichloroethylene and dried in an oven for 5 minutes at 60° C., being then allowed to cool to room temperature. As is conventional practice in applying photographic masking materials, such as materials of the type sold by the Eastman Kodak Company and called ortho resists, the substrate is placed on a vacuum jig which rotates about a vertical axis at about 2000 r.p.m. With the substrate 1 in a horizontal position, ortho resist material is applied at the spin center of the substrate and it is then allowed to spin for 30 seconds. After drying in an oven for 5 minutes at 60° C., the substrate is ready for the subsequent printing process.

A previously prepared negative conforming in the usual manner to the circuit to be formed on substrate 1 is placed in a holder aligned and parallel with the substrate. A print is then made from the negative and is developed by conventional procedures, leaving a contacting print on the surface of substrate 1. After the modified substrate is baked for 5 minutes in an oven at 125° C., the assembly is ready for etching.

The first step in the etching process is to protect the back or ground conducting plane 2 from the etchant by applying any suitable material which will prevent the etchant from contacting the ground plane. The assembly is then etched, first with any suitable gold etchant and then with any suitable chromium etchant. When the etching materials are removed by appropriate solvents, the structure left behind looks like that of FIG. 1, except that the absorbing section surface 6 is not uncovered and is totally spanned by a conductive layer of gold joining sections 4 and 5.

To uncover the absorptive section surface 6, a second similar photographic process is undertaken. Ortho resist material is applied as before to the entire surface of the microcircuit side of substrate 1. A new negative is aligned with the microcircuit and all of the circuit and substrate is exposed to light except for the absorptive section 6 from which the gold layer joining the conductors 4 and 5 is to be removed. The modified substrate is next placed in a gold etchant so that the gold material overlying section 6 is removed, exposing the chromium resistive film 3. The extent of removal of material in this step is monitored, for instance, by measuring the DC resistance between conductors 4 and 5 until the approximate value of resistance is reached.

In the final steps, conductors 4 and 5 are coated with additional gold to a permanent thickness on the order of 6 to 8 microns. Such a thickness is, of course, considerably greater than the skin depth of the microwave energy propagating in the gold-covered transmission line, so that the chromium layer 3 does not introduce substantial loss wherever it is covered by gold, such as at layers 4 and 5. This final gold coating is done, of course, after ortho resist or another suitable masking material is applied over the absorptive section 6, preventing the the deposition of gold on it. Also, in the final steps, the product device is washed in a conventional manner to remove traces of etchant, and other undesirable material such as any remaining masking material over surface 6 is also removed by conventional processes.

It is understood that the practice of the method described above may be modified in some detail and a successful product will still result. However, experience has taught that the described method reliably yields a superior product. A significant reduction in size, weight and price is also realized. An improved impedance match between a microstrip transmission line and ground is achieved without the use of external terminations and the bulky and expensive connectors required to use them. The improved termination has many applications in planar microwave circuits. For example, it is useful in hybrid circuits such as directional couplers, wherein it is customary to terminate one port in a matched impedance.

Also, planar circuit isolators are achieved by use of the invention. For example, use is made of the invention as a termination of one port of a triple-port circulator to cause the later to act as a microwave isolator.

Figure 2:
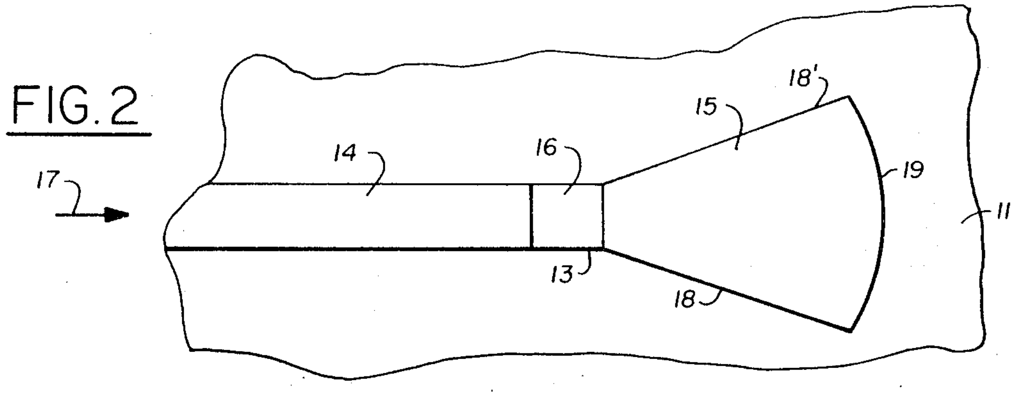
FIG. 2 is a top view of a second form of the invention of FIG. 1.

In FIG. 1, the band width of the assembly is limited by the particular reflectivity versus frequency characteristics of the λ/4 open stub 5. It is within the scope of the invention to employ instead other known stubs which have superior band width properties. As seen in FIG. 2, where parts corresponding to those in FIG. 1 are similarly numbered with a factor of 10 added, an alternative form employs a substrate 11 backed by a ground plate (not shown), with an evaporated chromium layer 13 and an evaporated gold layer 14 forming a microstrip line. At 16, a surface of layer 13 is exposed to form a microwave absorber. The evaporated gold overlay of stub 55 of FIG. 1 is replaced by a modified-shape stub section 15, also of gold. The gold overlay of stub 15 covers an evaporated chromium layer of shape similar to the gold overlay of stub 15. The combination forms a relatively broad band termination with radially extended sides 18, 18' and an arc-shaped end 19. Construction and operation are similar to the construction and operation of the device of FIG. 1.

Figure 3:
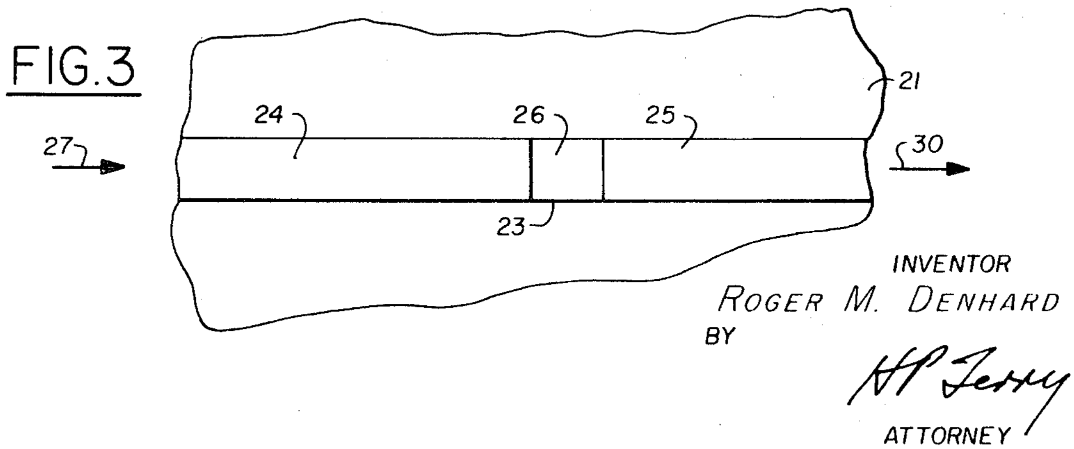
FIG. 3 is a similar top view of a form of the invention useful as a microcircuit attenuator.

Novel fixed attenuators are also constructed in a similar manner. As shown in FIG. 3, where parts corresponding to those in FIG. 1 are similarly numbered with a factor of 20 added, a planar microstrip attenuator similarly comprises a substrate 21 backed up by a ground plate (not shown), with an evaporated chromium layer 23 and an evaporated gold layer 24 forming an input microstrip transmission line. At 26, a surface of the chromium layer 23 is exposed to form the microwave absorber element. Beyond the absorber or attenuator section formed by the chromium surface 26, chromium layer 23 is covered with an evaporated gold layer 25. Layer 25 functions similarly to layer 24 (or layer 4 in FIG. 1), and conveys energy not absorbed at 26 propagating in the sense of arrow 30 to any desired utilization apparatus. The latter may, of course, be deposited on an extension of the dielectric substrate 21 in the direction of arrow 30.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. In a microcircuit comprising a body of low-loss dielectric material with first and second surfaces:
   an electrically conductive ground layer bonded to a first of said surfaces,
   an electrically conductive planar transmission line bonded to a portion of a second of said surfaces,
   said transmission line comprising layers of first and second metals,
   said first metal layer comprising a continuous layer of an electrically resistive metal bonded by vacuum evaporation to said dielectric material,
   said second metal layer comprising a layer of a highly electrically conductive metal bonded by vacuum evaporation to said first metal layer,
   said second metal layer extending over less than the total of said first layer so as to leave a part of said first layer exposed to high frequency energy propagated by said transmission line for absorption of at least a portion thereof.

2. Apparatus as described in claim 1 wherein said dielectric material is aluminum oxide with a dielectric loss tangent of substantially 0.001 or less.

3. Apparatus as described in claim 2 wherein said first layer is chromium and said second layer is gold.

4. Apparatus as described in claim 3 wherein said gold layer comprises at least two constituent layers.

5. Apparatus as in claim 3 wherein said chromium layer is substantially 200 to substantially 1500 Angstroms thick.

6. Apparatus as in claim 3 wherein said gold layer is substantially 6 to substantially 8 microns thick.

7. Apparatus as described by claim 1 wherein the resistivity of said chromium layer is substantially equal to the characteristic impedance of said transmission line.

8. Apparatus as described in claim 1 wherein the said exposed part of said chromium layer has a length substantially equal to one-half the width of said transmission line.

9. Apparatus as described in claim 1 wherein the said exposed part of chromium layer separates first and second mutually noncontacting portions of said gold layer.

10. Apparatus as described by claim 9 wherein said second of said first and second mutually noncontacting portions of said gold layer forms a quarter wave reflecting stub transmission line at the operating wave length for the reflection of high frequency energy at the junction of said chromium layer and said second gold layer.

11. Apparatus as described by claim 9 wherein said second of said first and second portions of said gold layer forms a transmission line adapted to be coupled to utilization equipment.